(12) United States Patent
Ando et al.

(10) Patent No.: US 11,916,099 B2
(45) Date of Patent: Feb. 27, 2024

(54) MULTILAYER DIELECTRIC FOR METAL-INSULATOR-METAL CAPACITOR

(71) Applicant: International Business Machines Corporation, Armonk, NY (US)

(72) Inventors: Takashi Ando, Eastchester, NY (US); Reinaldo Vega, Mahopac, NY (US); David Wolpert, Poughkeepsie, NY (US); Cheng Chi, Jersey City, NJ (US); Praneet Adusumilli, Somerset, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/341,489

(22) Filed: Jun. 8, 2021

(65) Prior Publication Data
US 2022/0392995 A1   Dec. 8, 2022

(51) Int. Cl.
*H01L 29/51* (2006.01)
*H01L 49/02* (2006.01)

(52) U.S. Cl.
CPC ............ *H01L 28/60* (2013.01); *H01L 29/516* (2013.01)

(58) Field of Classification Search
CPC ....... H01L 28/60; H01L 29/516; H01L 28/56; H01L 28/40
See application file for complete search history.

(56) References Cited

U.S. PATENT DOCUMENTS

| | | |
|---|---|---|
| 5,383,150 A | 1/1995 | Nakamura et al. |
| 6,346,741 B1 | 2/2002 | Van Buskirk et al. |
| 10,797,178 B2 | 10/2020 | Zhu et al. |
| 2016/0064391 A1 | 3/2016 | Li et al. |
| 2017/0104055 A1* | 4/2017 | Zampardi ............... H01L 28/60 |
| 2017/0256552 A1* | 9/2017 | Schröder ............. G11C 11/2275 |
| 2020/0350324 A1* | 11/2020 | Hoffmann ............... H01L 28/60 |
| 2021/0098060 A1* | 4/2021 | Ni ........................ G11C 11/5657 |
| 2021/0375890 A1* | 12/2021 | Chia ................. H01L 29/40111 |
| 2022/0271046 A1* | 8/2022 | Huang .................... H01L 28/55 |

FOREIGN PATENT DOCUMENTS

| | | |
|---|---|---|
| CN | 112018185 A | 12/2020 |
| EP | 0987755 A2 | 3/2000 |
| JP | 01093030 A | 4/1989 |
| KR | 20020010818 A | 2/2002 |

OTHER PUBLICATIONS

Qi et al, "Ferroelectricity of as-deposited HZO fabricated by plasma-enhanced atomic layer deposition at 300 ° C. by inserting TiO2 interlayers," Appl. Phys. Lett. 118, 032906, 2021, Published Online: Jan. 21, 2021 (Year: 2021).*

* cited by examiner

*Primary Examiner* — Julia Slutsker
(74) *Attorney, Agent, or Firm* — Jeffrey M. Ingalls

(57) ABSTRACT

A semiconductor device is provided. The semiconductor device includes: a first conductive electrode; a first dielectric stack structure provided on the first conductive electrode; a second conductive electrode provided on the first dielectric stack structure; a second dielectric stack structure provided on the second conductive electrode; and a third conductive electrode provided on the first dielectric stack structure, wherein each of the first dielectric stack structure and the second dielectric stack structure include a first dielectric layer comprising a first material; a second ferroelectric dielectric layer comprising a second material and provided on the first dielectric layer, and a third dielectric layer comprising a third material and provided on the second ferroelectric dielectric layer.

10 Claims, 6 Drawing Sheets

MULTILAYER DIELECTRIC FOR METAL-INSULATOR-METAL CAPACITOR

BACKGROUND

The present disclosure relates generally to fabrication methods and resulting structures for capacitors and, in particular, to a multilayer dielectric for metal-insulator-metal capacitor (MIMCAP) capacitance and leakage improvement.

Semiconductor device manufacturing and design are continually packaging more circuits into semiconductor chips as line widths and spacing between device elements shrink, while still striving for increasing semiconductor device performance. Traditionally, transistors are formed on the semiconductor substrate and are connected together by layers of interconnects and power structures formed above the transistors. Conventional power rails, commonly used with memory devices such as static-random access memory (SRAM), typically reside in the interconnect layers above the transistors. Conventional power rails in interconnect layers consume a significant amount of area and to meet semiconductor performance requirements. In certain examples, de-coupling capacitors, such as MIMCAPs formed in the interconnect layers, or deep trench capacitors formed in an insulating layer of a silicon-on-insulator semiconductor substrates, may be used to reduce power rail noise and increase semiconductor device performance.

Stacked capacitors (>2 electrodes) with metal/insulator (high-κ)/metal stacks have been proposed for MIMCAP devices. In order to obtain sufficiently high capacitance density per area, 3-D capacitor structures have been employed, in addition to a κ-value increase for the high-κ insulator.

A multiple electrode (>2) stacked capacitor may help address challenges related to capacitance density for decoupling capacitors. Since the electrical bias polarities are opposite for the bottom capacitor and the top capacitor in the three electrode stacked capacitor, the thickness of the high-κ material may need to be sufficiently thick to pass reliability specifications for the weaker side. Thus, there may be a need for improved designs for stacked capacitors.

SUMMARY

Embodiments of the present disclosure relate to a semiconductor structure. The semiconductor structure includes: a first conductive electrode; a first dielectric stack structure provided on the first conductive electrode; a second conductive electrode provided on the first dielectric stack structure; a second dielectric stack structure provided on the second conductive electrode; and a third conductive electrode provided on the first dielectric stack structure, wherein each of the first dielectric stack structure and the second dielectric stack structure include a first dielectric layer comprising a first material; a second ferroelectric dielectric layer comprising a second material and provided on the first dielectric layer, and a third dielectric layer comprising a third material and provided on the second ferroelectric dielectric layer.

Embodiments of the present disclosure relate to a method of manufacturing a semiconductor device. The method includes: forming a first conductive electrode; forming a first dielectric stack structure on the first conductive electrode; forming a second conductive electrode on the first dielectric stack structure; forming a second dielectric stack structure on the second conductive electrode; and forming a third conductive electrode on the first dielectric stack structure, wherein each of the first dielectric stack structure and the second dielectric stack structure include a first dielectric layer comprising a first material; a second ferroelectric dielectric layer comprising a second material and provided on the first dielectric layer, and a third dielectric layer comprising a third material and provided on the second ferroelectric dielectric layer.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
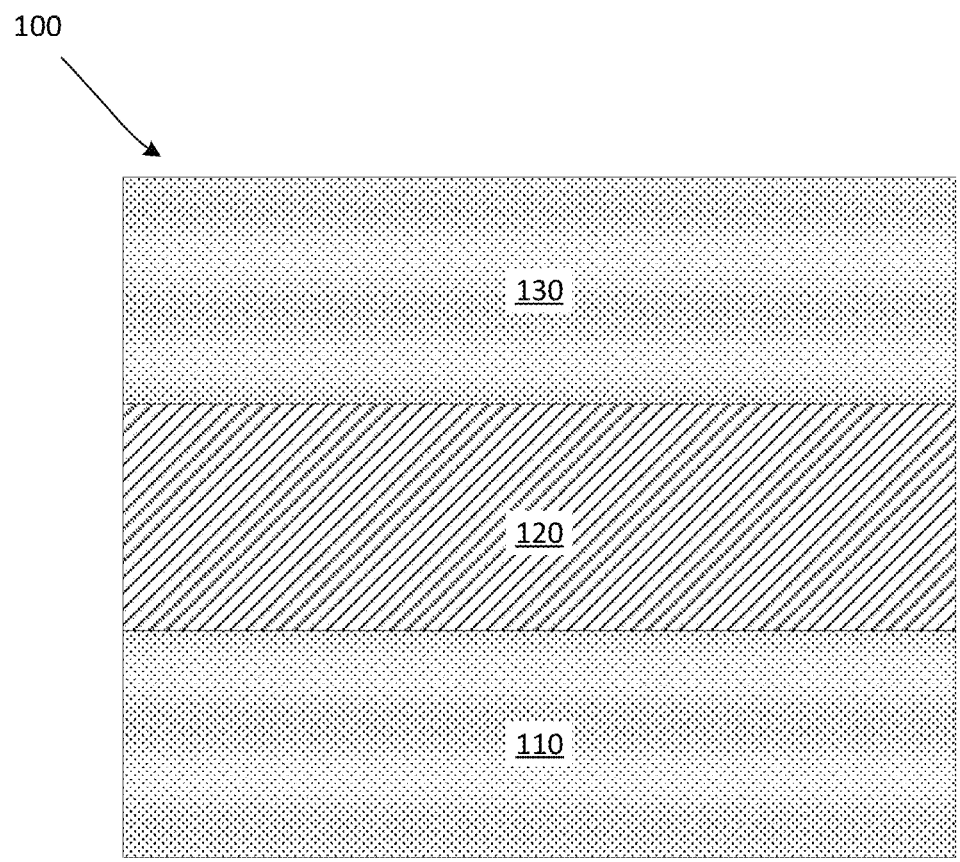
FIG. 1 shows a schematic cross-sectional diagram for an exemplary multilayer dielectric stack for a metal-insulator-metal capacitor (MIMCAP), in accordance with an embodiment.

The present disclosure is directed to a multilayer dielectric stack (hereinafter interchangeably referred to as "multilayer dielectric" in short) for a metal-insulator-metal capacitor (MIMCAP). The multilayer dielectric may provide for capacitance and leakage improvements in a MIMCAP device.

In an embodiment, a tri-layer stack of $TiO_2$/FE-$HfO_2$/$TiO_2$ is used as a multilayer dielectric in a stacked capacitor (more than 2 electrodes). The tri-layer stack improves capacitance density compared to, for example, $Al_2O_3$/$HfO_2$/$Al_2O_3$, thus enabling high-κ thickness scaling. That is, the use of $TiO_2$ and ferroelectric HfO2 in the tri-layer stack contributes to a, for example, about 2× or more capacitance enhancement associated with symmetric electric behaviors due to certain negative capacitance effects. While $TiO_2$ is used in the aforementioned tri-layer stack, in other embodiments, other oxides and/or nitrides and/or oxynitrides (e.g., $Ta_2O_5$) may be used in place of $TiO_2$, while maintaining the spirit of the present embodiments.

In an embodiment, a tri-layer layer stack of $TiO_2$/FE-$HfO_2$/$TiO_2$ is used as a as a multilayer dielectric in 3-plate MIMCAP.

In certain embodiments, the MIMCAP device may have applications as an embedded dynamic random access memory (DRAM) device, or as a decoupling capacitor, in back-end-of-line (BEOL) application, etc. However, these applications are merely examples of applications for the MIMCAPs of the present embodiments.

As used herein, a "DRAM" refers to a memory device wherein a basic cell is provided with a selection transistor and a capacitor. A gate of the selection transistor is connected to a word line, a drain thereof is connected to a bit line, and a source thereof is connected to an electrode or the capacitor. A gate of the selection transistor is connected to a word line, a drain thereof is connected to a bit line, and a source thereof is connected to an electrode or the capacitor that is, to an earthed electrode.

As used herein, the term "capacitor" denotes a structure including one or more pairs of electrically conductive materials separated and insulated from each other by a multilayer dielectric for storing a charge. Certain of the present embodiments specifically applies to the multilayer dielectric in a metal-insulator-metal capacitor (MIMCAP). In an embodiment, the MIMCAP includes three or more electrodes (e.g., five, or seven or more electrodes).

As used herein, the term "electrode" denotes a component of a capacitor representing one of at least two electrically conductive materials of the capacitor that are separated by a multilayer dielectric in accordance with the present embodiments.

As used herein, the term "dielectric" denotes a nonmetallic material having a room temperature conductivity of less than about 10–10(–m)–1.

As used herein, the term "high-κ" denotes a material having a dielectric constant (κ) that is greater than the dielectric constant of silicon oxide ($SiO_2$) at room temperature (20° C.-25° C.) and atmospheric pressure (1 atm).

The flowcharts and cross-sectional diagrams in the Figures illustrate methods of manufacturing nanosheet FET devices according to various embodiments. In some alternative implementations, the manufacturing steps/operations may occur in a different order that that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Referring now to the drawings in which like numerals represent the same or similar elements and initially to FIG. 1, this figure shows a schematic cross-sectional diagram for an exemplary multilayer dielectric stack 100 for a metal-insulator-metal capacitor (MIMCAP), in accordance with an embodiment. It is to be appreciated that the elements of multilayer dielectric stack 100 are not shown drawn to scale, for the sake of illustration and clarity.

The multilayer dielectric stack (hereinafter "multilayer dielectric" in short) 100 includes a first layer 110, a second layer 120, and a third layer 130, according to certain embodiments. The first layer 110 may be formed of $TiO_2$. The second layer 120 may be formed of ferroelectric $HfO_2$ (or FE-$HfO_2$) FE-$HfO_2$. The third layer 130 may be formed of $TiO_2$. In certain embodiments, the ferroelectric $HfO_2$ (FE-$HfO_2$) may be: undoped; Zr-doped; Si-doped; Al-doped; Y-doped; La-doped; Gd-doped; or other species that crystallize FE-$HfO_2$ to orthorhombic phase with back-end-of-line (BEOL) temperatures (e.g., at <450° C. with a conventional anneal; at higher temperatures with a laser spike anneal; or with a flash lamp anneal). The tri-layer stack (or multilayer dielectric 100) of the present embodiments may allow the dielectric breakdown behavior to be symmetric for both biasing polarities. Moreover, it should be appreciated that the multilayer dielectric stack 100 includes two non-ferroelectric layers (i.e., the first layer 110 and the third layer 130) connected in series with a ferroelectric layer (i.e., the second layer 120).

In certain embodiments employing a stacked capacitor (i.e., having more than two electrodes), the $TiO_2$ discussed above with respect to the first layer 110 and the third layer 130 may be substituted with $Ta_2O_5$.

The first layers 110, the second layer 120, and the third layer 130 may be formed using any known or yet to be invented layer forming techniques including, but not limited to, spinning from solution, spraying from solution, atomic layer deposition (ALD), chemical vapor deposition (CVD), plasma enhanced CVD (PECVD), sputter deposition, reactive sputter deposition, ion-beam deposition, and evaporation.

Figure 2:
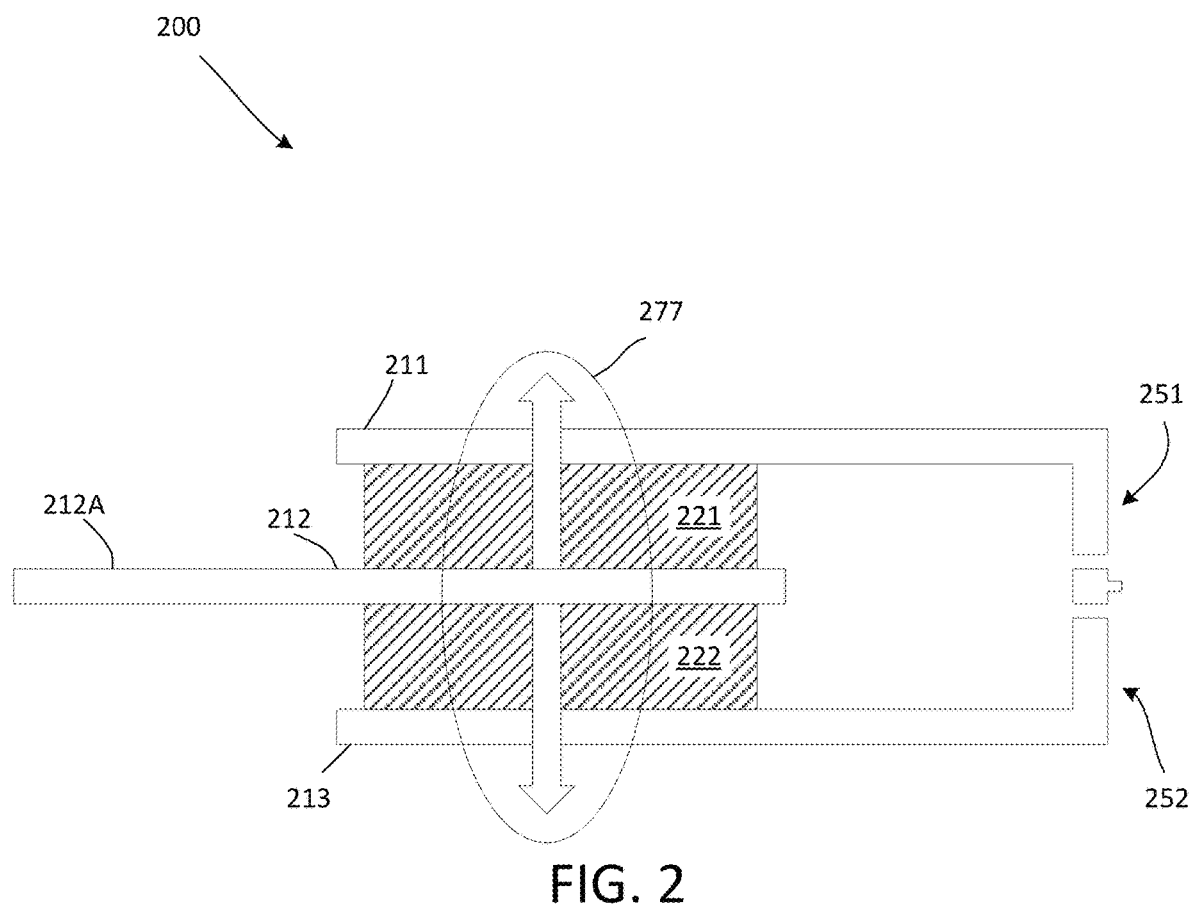
FIG. 2 shows a schematic cross-sectional diagram for an exemplary metal-insulator-metal capacitor (MIMCAP), in accordance with an embodiment.

FIG. 2 shows a schematic diagram for an exemplary metal-insulator-metal capacitor (MIMCAP) 200, in accordance with an embodiment. It is to be appreciated that the elements of MIMCAP 200 are not shown drawn to scale, for the sake of illustration and clarity.

The MIMCAP 200 includes a first plate 211, a first multilayer dielectric stack 221 (e.g., see the multilayer dielectric stack 100 shown in FIG. 1), a second plate 212, a second multilayer dielectric stack 222 (e.g., see the multilayer dielectric stack 100 shown in FIG. 1), and a third plate 213. The second plate 212 is connected to an electrode 212A. The first plate 211 and the third plate 213 are connected to yet another electrode (not shown). Each of the first multilayer dielectric stack 221 and the second multilayer dielectric stack 222 may be implemented by, e.g., the multilayer dielectric stack 100 of FIG. 1. The plates may be comprised of an electrically conductive material(s).

The first plate 211, the first multilayer dielectric stack 221, and the second plate 212 form a first capacitor 251, while the second plate 212, the second multilayer dielectric stack 222, and the third plate 213 form a second capacitor 252. The electrical bias polarities 277 are opposing for the first capacitor 251 and the second capacitor 252. However, the use of $TiO_2$ and ferroelectric $HfO_2$ in a symmetric stack contributes to an improved capacitance density (e.g., >2×) with symmetric electric behaviors due to a negative capacitance effect that is achieved with the particular multilayer dielectric stack 100 configurations and material compositions of the present embodiments.

It should be appreciated that although three plates are shown with respect to FIG. 2, that the concepts related to the multilayer dielectric stack 100 described with respect to FIG. 1 may be used in a MIMCAP device with more than three plates (e.g., 5 plates, or 7 plates, or more).

Figure 3:
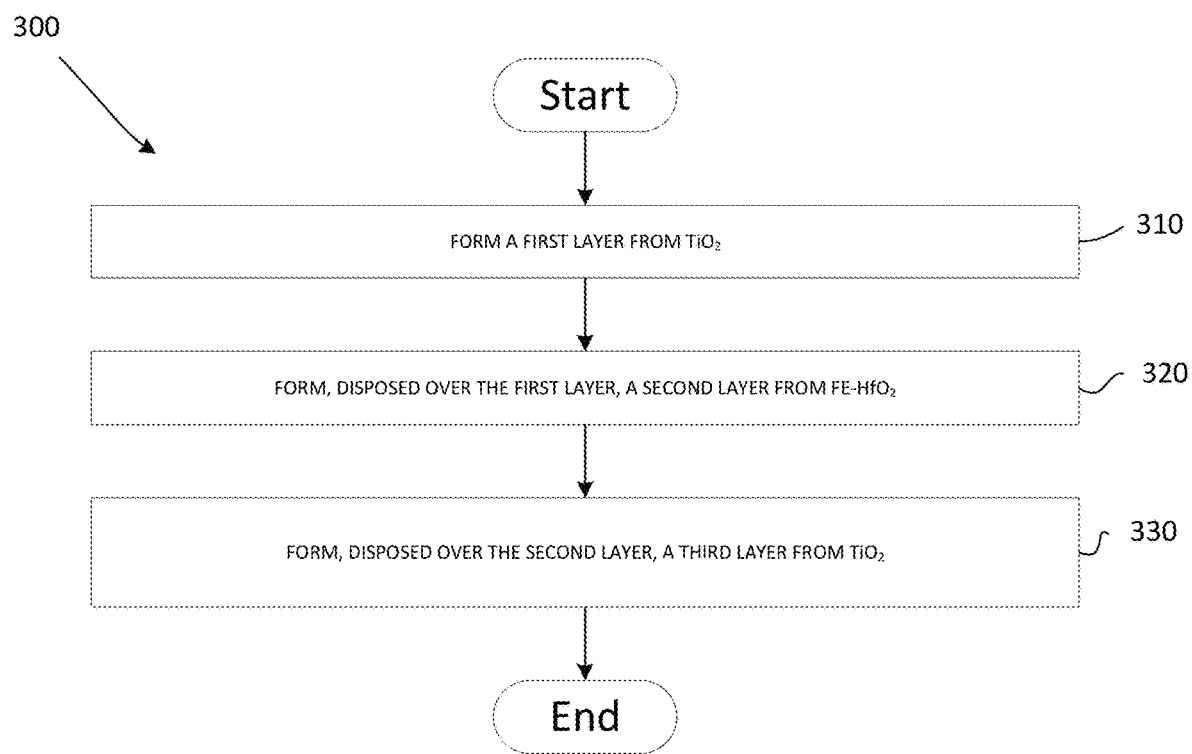
FIG. 3 shows an exemplary method for forming a multilayer dielectric stack for a metal-insulator-metal capacitor stack, in accordance with an embodiment.

FIG. 3 shows an exemplary method 300 for forming a multilayer dielectric stack for a metal-insulator-metal capacitor (MIMCAP) stack, in accordance with an embodiment.

At operation 310, form a first layer from $TiO_2$. Of course, other electrical insulating compounds can be used for the first layer, while maintaining the spirit of the present embodiments.

At operation 320, form, disposed over the first layer, a second layer from FE-$HfO_2$ At operation 330, form, disposed over the second layer, a third layer from $TiO_2$. Of course, other electrical insulating compounds can be used for the third layer, while maintaining the spirit of the present embodiments.

Figure 4:
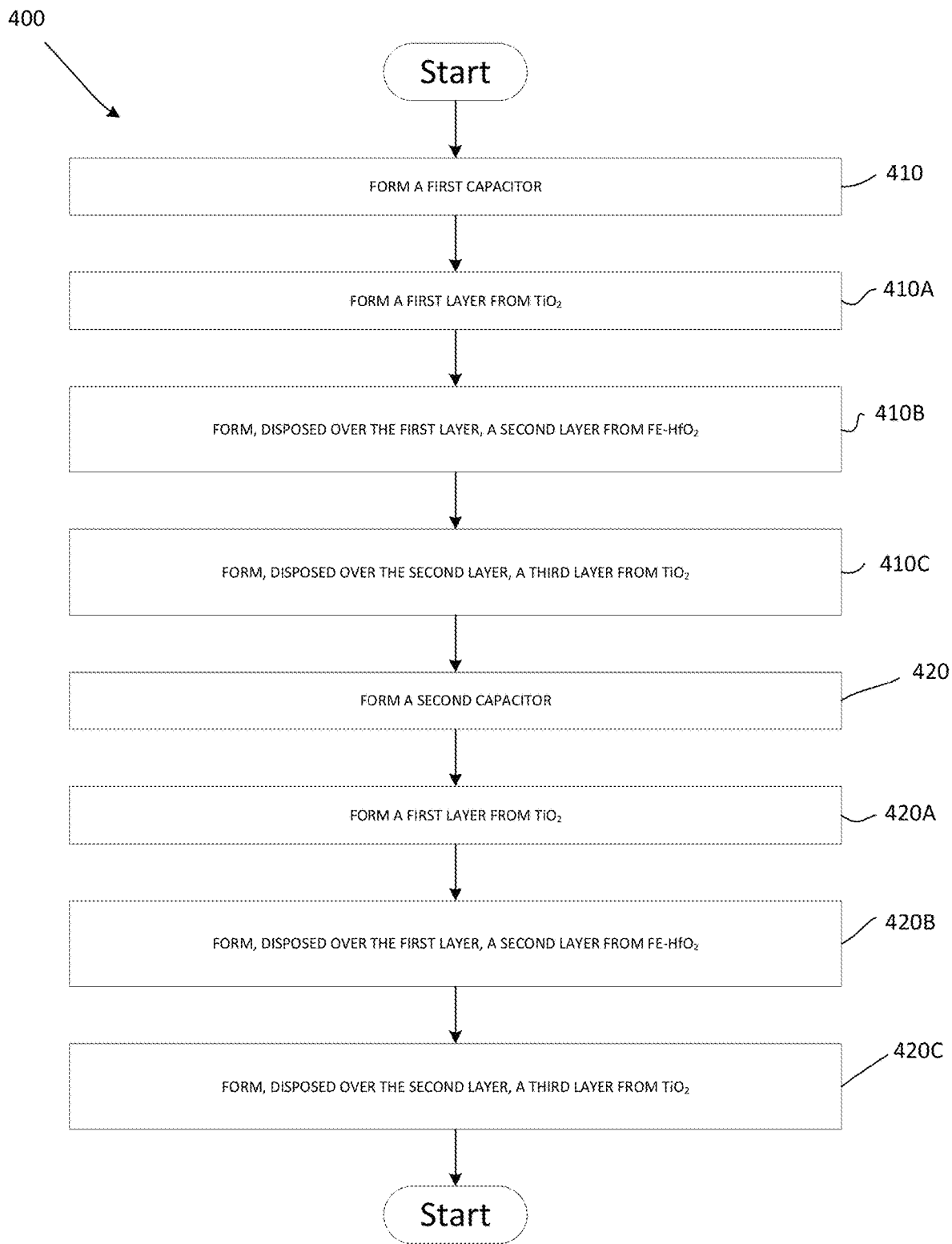
FIG. 4 shows an exemplary method for forming a metal-insulator-metal capacitor (MIMCAP), in accordance with an embodiment.

FIG. 4 shows an exemplary method 400 for forming a metal-insulator-metal capacitor (MIMCAP), in accordance with an embodiment.

At operation 410, form a first capacitor.

In an embodiment, operation 410 includes operation 410A-410C relating to the formation of a tri-layer dielectric stack (for the first capacitor) in accordance with an embodiment.

At operation 410A, form a first layer from $TiO_2$. Of course, other electrical insulating compounds can be used for the first layer, while maintaining the spirit of the present embodiments.

At operation 420B, form, disposed over the first layer, a second layer from FE-$HfO_2$ At operation 430C, form, disposed over the second layer, a third layer from $TiO_2$. Of course, other electrical insulating compounds can be used for the third layer, while maintaining the spirit of the present embodiments.

At operation 420, form, disposed over the first capacitor, a second capacitor.

In an embodiment, operation 420 includes operations 420A-420C relating to the formation of a tri-layer dielectric stack (for the second capacitor) in accordance with an embodiment.

At operation 420A, form a first layer from $TiO_2$. Of course, other compounds can be used for the first layer, while maintaining the spirit of the present embodiments.

At operation 420B, form, disposed over the first layer, a second layer from FE-$HfO_2$.

At operation 420C, form, disposed over the second layer, a third layer from $TiO_2$. Of course, other compounds can be used for the third layer, while maintaining the spirit of the present embodiments.

In an embodiment, the first capacitor and the second capacitor can share at least one plate. It is to be appreciated that not every aspect of forming a MIMCAP is shown in FIG. 4 for the sake of brevity, as FIG. 4 is primarily directed to the formation of tri-layer dielectric stacks in a MIMCAP (as described with respect to operations 410A-C and 420A-C).

Figure 5:
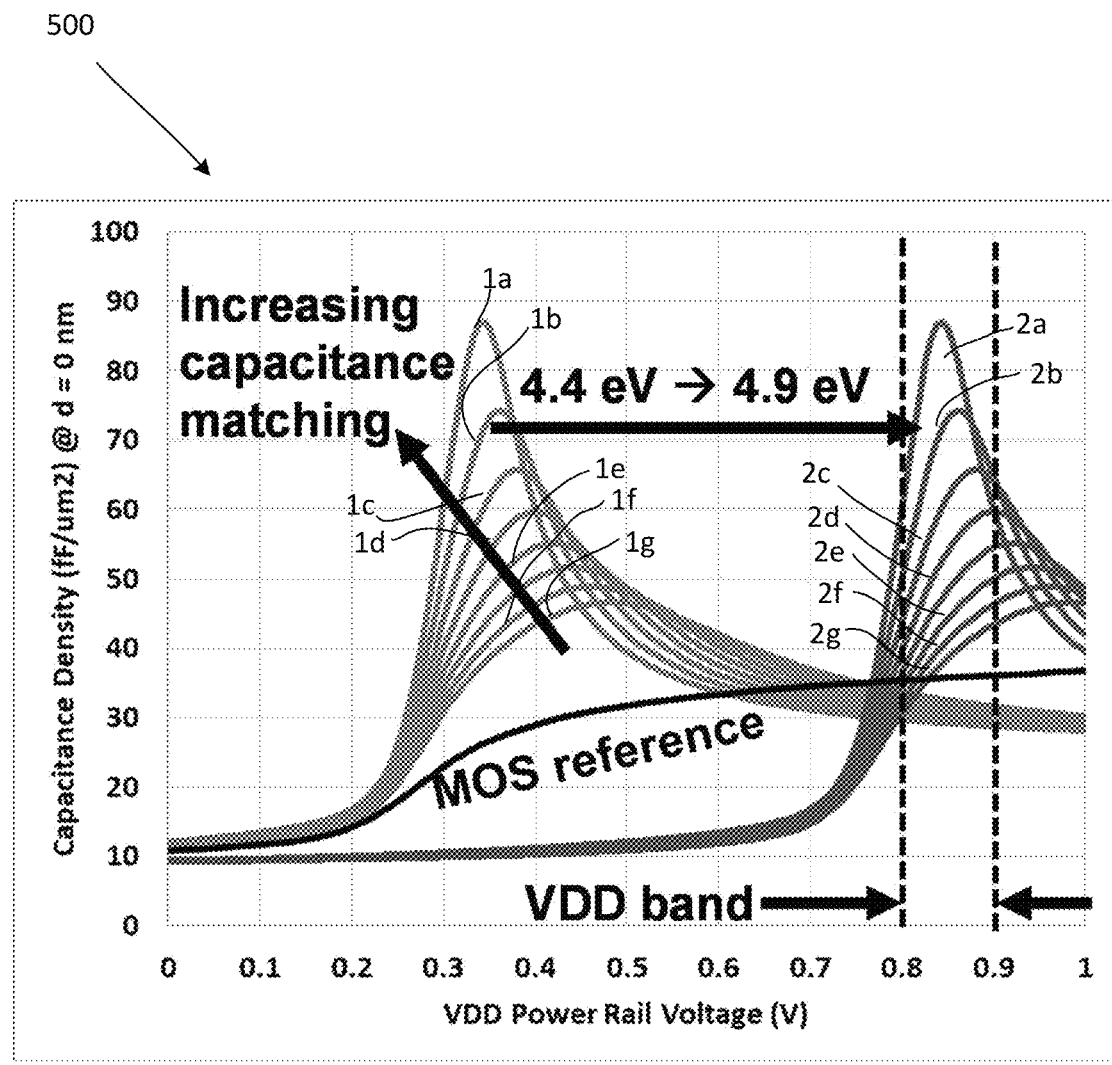
FIG. 5 is a graph depicting the results of a technology computer aided design (TCAD) analysis of a 4.4 eV work function metal placed on top of a ferroelectric material and a 4.9 eV work function metal placed on top of a ferroelectric material, in accordance with an embodiment.

FIG. 5 is a graph 500 depicting the results of TCAD analysis of a 4.4 eV work function metal (WFM), placed on top of ferroelectric layer 21, and a 4.9 eV work function metal, placed on top of the ferroelectric layer. Technology computer-aided design (TCAD) is a branch of electronic design automation that models semiconductor fabrication and semiconductor circuit operation. As depicted in FIG. 5, TCAD analysis predicts capacitance density for a specific Vdd power rail voltage (i.e., where Vdd is the voltage applied to the drain of the transistor) that is depicted as a capacitance vs. voltage (C-V) curve. The TCAD analysis assumes a thickness of 4 nm for ferroelectric layer and a thickness of 1 nm for the dielectric layer (e.g., silicon dioxide). The TCAD analysis uses a ferroelectric remnant polarization of approximately 2.85 uC/cm$^2$ and a dielectric Qmax of about 3.45 μC/cm$^2$, where Qmax is the maximum amount of electrical charge that can be applied to the dielectric before the dielectric breaks down. The single lower line is a reference line for the prediction for a metal oxide semiconductor (MOS) de-coupling capacitor with a 4.4 eV work function metal, a 1 nm silicon dioxide dielectric, and the same geometry as the ferroelectric/dielectric capacitors also simulated.

Typically, a 4.4 eV WFM is commonly associated with a NFET operation and a 4.9 eV WFM is commonly associated with a PFET operation. The remnant polarization (Pr) is 2.85 μC/cm$^2$ (e.g., less than silicon dioxide), and Qmax is approximately 3.45 μC/cm$^2$.

Each of the lines 1a, 1b, 1c, 1d, 1e, 1f and 1g for a 4.4 eV work function metal on a ferroelectric material (e.g., ferroelectric HfO$_2$ second layer 120 shown in FIG. 1) represents a predicted capacitance density associated with a specific possible negative capacitance slope where the specific negative capacitance slope may be associated with a specific material selection (e.g., for ferroelectric layer) or a different material thickness forming the de-coupling capacitors depicted in FIGS. 1 and 2, for example. Each of lines 1a, 1b, 1c, 1d, 1e, 1f and 1g represents a predicted capacitance density in femtofarads (fF) per square micron (μm$^2$) versus voltage (V) where the voltage is the Vdd power rail voltage. The peaks of the curves for lines 1a, 1b, 1c, 1d, 1e, 1f and 1g are representative of a voltage of 0.3 to 0.4 V for the Vdd power rail. The arrow depicted on lines 1a, 1b, 1c, 1d, 1e, 1f and 1g depicts increasing capacitance matching. Moving backwards from line 1g to 1a, the negative capacitance slope of the ferroelectric is reduced in order to achieve an absolute value slope that is closer to the series dielectric positive capacitance, with line 1a representing the closest match between these two slopes. Increasing capacitance matching results in an increase in dQ/dV, which increases the total capacitance of the ferroelectric/dielectric series stack.

Similarly, each of the lines 2a, 2b, 2c, 2d, 2e, 2f and 2g for a 4.9 eV work function metal on a ferroelectric material (e.g., ferroelectric HfO$_2$ second layer 120 shown in FIG. 1) represents a predicted capacitance density associated with a specific possible negative capacitance slope where the specific negative capacitance slope may associated with a specific material selection (e.g., for ferroelectric layer 21) or a different material thickness forming the de-coupling capacitors depicted in FIGS. 1 and 2, for example. The peak of the curves for line 2a, 2b, 2c, 2d, 2e, 2f and 2g are representative of a voltage of 0.8 to 0.9 V for the Vdd power rail.

As understood from FIG. 5, in certain embodiments, the negative capacitance C-V curves are determined by matching of dielectric and ferroelectric capacitances. This particular example show approximately a 2× gain over a paraelectric device. An additional gain may be possible with better capacitance matching, but there may be a trade-off with the Vdd band depending on remnant polarization. Better capacitance matching at the same Pr may reduce the Vdd band.

Figure 6:
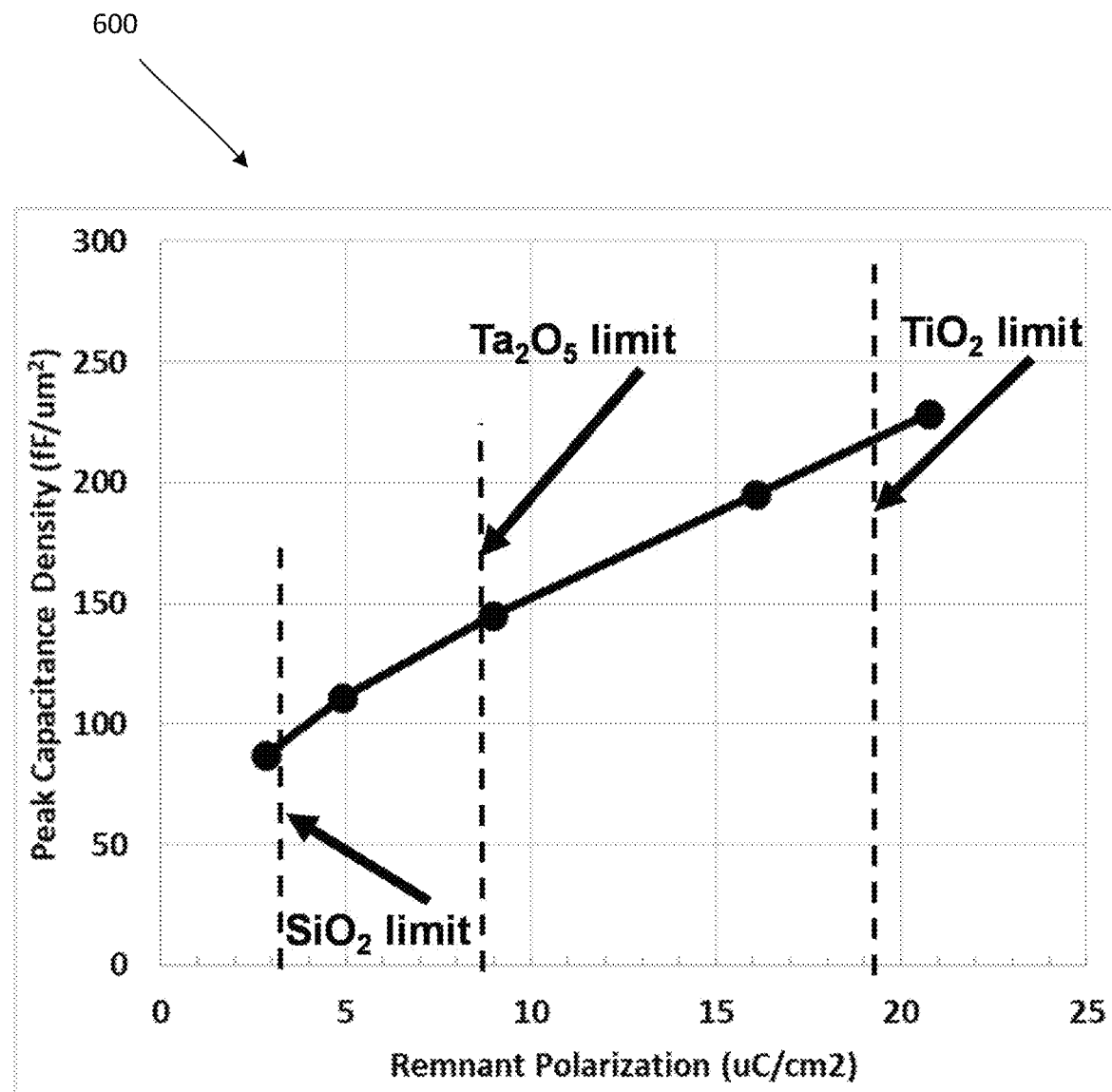
FIG. 6 is a graph depicting a peak capacitance versus remnant polarization for various materials, in accordance an embodiment.

FIG. 6 is a graph 600 depicting a peak capacitance versus remnant polarization for various materials in accordance with the present embodiments. As depicted, FIG. 6 provides a predicted peak capacitance in fF/μm$^2$ with various ferroelectric remnant polarizations (Pr) in μC/cm$^2$. Also depicted on FIG. 6 is a dielectric breakdown limit (Qmax) for several materials, such as, SiO$_2$, Ta$_2$O$_5$, and TiO$_2$. It is important to note that FIG. 6 illustrates the theoretical, potential ability to increase a peak capacitance density with a material by using a material capable of providing a higher Qmax. As depicted in FIG. 6, increasing remnant polarization (Pr) may dramatically increase peak capacitance. It may require a non-SiO$_2$ dielectric to be in series with the ferroelectric layer in order to avoid breakdown. In an example, Ta$_2$O$_5$ has k~25 and E$_{br}$~4 MV/cm→Qmax~8.9 uC/cm$^2$. In another example, TiO$_2$ has k~55 and E$_{br}$~4 MV/cm→Qmax~19.5 uC/cm$^2$.

It is to be understood that aspects of the present disclosure will be described in terms of a given illustrative architecture. However, other architectures, structures, substrate materials and process features and steps can be varied within the scope of aspects of the present embodiments.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment," as well as other variations thereof, means that a particular feature, structure, characteristic, and so forth described in connection with the embodiment is included in at least one embodiment. Thus, the appearances of the phrase "in one embodiment" or "in an embodiment," as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between' two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A metal-insulator-metal capacitor (MIMCAP) device comprising:
    a first conductive electrode;
    a first dielectric stack structure provided on the first conductive electrode;
    a second conductive electrode provided on the first dielectric stack structure;
    a second dielectric stack structure provided on the second conductive electrode; and
    a third conductive electrode provided on the first dielectric stack structure,
    wherein the first dielectric stack structure includes
        a first dielectric layer comprising a first non-ferroelectric material in contact with the first conductive electrode,
        a second ferroelectric dielectric layer comprising a second material in direct physical contact with the first dielectric layer, and
        a third dielectric layer comprising a third non-ferroelectric material in contact with the second conductive electrode and in direct physical contact with the same second ferroelectric dielectric layer.

2. The MIMCAP device of claim 1, wherein the first non-ferroelectric material is a first metal oxide electrical insulator, and the third non-ferroelectric material is a second metal oxide electrical insulator.

3. The MIMCAP device of claim 2, wherein the first metal oxide electrical insulator and the second metal oxide electrical insulator are comprised of a same material to provide symmetrical electrical properties.

4. The MIMCAP device of claim 1, further comprising a fourth conductive electrode and a fifth conductive electrode.

5. The MIMCAP device of claim 1, wherein the first non-ferroelectric material and the third non-ferroelectric material are $TiO_2$.

6. The MIMCAP device of claim 5, wherein the second material is ferroelectric $HfO_2$ (FE-$HfO_2$).

7. The MIMCAP device of claim 1, wherein the first non-ferroelectric material and the third non-ferroelectric material are $Ta_2O_5$.

8. The MIMCAP device of claim 7, wherein the second material is ferroelectric $HfO_2$ (FE-$HfO_2$).

9. The MIMCAP device of claim 1, wherein the first dielectric layer, the second dielectric layer, and the third dielectric layer are each formed by atomic layer deposition (ALD), chemical vapor deposition (CVD), or plasma enhanced CVD (PECVD).

10. The MIMCAP device of claim 1, wherein the first dielectric layer, the second ferroelectric dielectric layer, and the third dielectric layer are each formed during a Back End of Line (BEOL) portion of an integrated circuit formation process.

* * * * *